US006649459B2

(12) United States Patent
Deboy et al.

(10) Patent No.: US 6,649,459 B2
(45) Date of Patent: Nov. 18, 2003

(54) METHOD FOR MANUFACTURING A SEMICONDUCTOR COMPONENT

(75) Inventors: Gerald Deboy, München (DE); Wolfgang Friza, Villach (AT); Oliver Häberlen, Villach (AT); Michael Rüb, Faak Am See (AT); Helmut Strack, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/817,594

(22) Filed: Mar. 26, 2001

(65) Prior Publication Data

US 2001/0053568 A1 Dec. 20, 2001

Related U.S. Application Data

(63) Continuation of application No. PCT/DE99/03081, filed on Sep. 24, 1999.

(30) Foreign Application Priority Data

Sep. 24, 1998 (DE) .......................... 198 43 959

(51) Int. Cl.[7] .................. H01L 21/338; H01L 21/8242; H01L 21/8236
(52) U.S. Cl. ................ 438/173; 438/243; 438/268; 438/270
(58) Field of Search ................ 438/173, 242, 438/243, 270, 268

(56) References Cited

U.S. PATENT DOCUMENTS

| 5,021,355 A | * | 6/1991 | Dhong et al. ............ 438/270 |
| 5,216,275 A | | 6/1993 | Chen ..................... 257/493 |
| 5,384,152 A | * | 1/1995 | Chu et al. ............... 117/108 |
| 5,438,215 A | | 8/1995 | Tihanyi ................. 257/401 |

FOREIGN PATENT DOCUMENTS

| DE | 43 09 764 A1 | 9/1994 |
| DE | 197 36 981 A1 | 8/1998 |
| WO | WO 97/29518 | 8/1997 |

OTHER PUBLICATIONS

Chen Xingbi: "Theory of a Novel Voltage Sustaning (CB) Layer for Power Devices", Chinese Journal of Electronics, vol. 7, No. 3, Jul. 1998, pp. 211–216.

* cited by examiner

Primary Examiner—Olik Chaudhuri
Assistant Examiner—William M. Brewster
(74) Attorney, Agent, or Firm—Laurence A. Greenberg; Werner H. Stemer; Ralph E. Locher (57) ABSTRACT

The invention relates to a method for producing a semiconductor component including semiconductor areas of different conductivity types which are alternately positioned in a semiconductor body. The semiconductor areas of different conductivity types extend at least from one first zone to a position near a second zone. Because of variable doping in trenches and in the trench fillings, an electric field is generated which increases from both the first zone and the second zone.

14 Claims, 7 Drawing Sheets

METHOD FOR MANUFACTURING A SEMICONDUCTOR COMPONENT

CROSS-REFERENCE TO RELATED APPLICATION

The application is a continuation of copending International Application No. PCT/DE99/03081, filed Sep. 24, 1999, which designates the United States.

BACKGROUND OF THE INVENTION

1. Field of the Invention

The present invention relates to a method for manufacturing a semiconductor component having a semiconductor element with a blocking pn-type junction. The blocking pn-type junction is formed by a first zone of a first conduction type and an adjoining zone of a second conduction type that is opposite to the first conduction type. The first zone of the first conduction type is connected to a first electrode. A second zone of the first conduction type is connected to a second electrode. The side of the zone of the second conduction type which faces the second zone forms a first surface. Areas of the first and second conduction types are integrated together in the region between the first surface and a second surface lying between the first surface and the second zone.

Such semiconductor components are also referred to as compensation components. Such compensation components are, for example, n-type or p-type channel MOS field effect transistors, diodes, thyristors, GTOs or else other elements. However, the following text will be based on an example of a field effect transistor (also referred to as "transistor" for short).

Various theoretical investigations have been made into compensation components over a long period of time (see U.S. Pat. No. 4,754,310 and U.S. Pat. No. 5,216,275), but these investigations have been directed toward improving the switchover resistance RSDon. They have not been directed toward improving the stability under current loading, and in particular, have not been directed toward improving the robustness in relation to avalanche and short-circuiting with high current and a high source-drain voltage. Compensation components are based on mutual compensation of the charge of n-type and p-type doped areas in the drift region of the transistor. The areas are spatially configured here in such a way that the line integral over the doping along a line running vertically with respect to the pn-type junction remains in each case below the breakdown charge specific to the material (silicon approximately $2*10^{12}$ cm$^{-2}$). For example, in a vertical transistor such as is customary in power electronics, it is possible to configure p-type and n-type columns or plates etc., in pairs. In a lateral structure, p-type and n-type conductive layers can be stacked alternately one on top of the other in a lateral configuraion between a trench covered by a p-type conductive layer and a trench covered by an n-type conductive layer (see U.S. Pat. No. 4,754,310).

The large degree of compensation of the p-type and n-type doping enables the doping of the current-conducting region (the n-type region for n-type channel transistors and the p-type region for p-channel transistors) to be significantly increased in compensation components, which results in a significant gain in switch-on resistance RDSon despite the loss of current-conducting area. The switch-off capability of the transistor depends here essentially on the difference between the two dopings. Because doping of the current-conducting area which is at least one order of magnitude higher is desired in order to reduce the switch-on resistance, a controlled setting of the compensation degree, which can be defined for values in the region $\leq\pm10\%$, is required to control the switch-off voltage. When the gain in terms of switch-on resistance is higher, the aforesaid region becomes even smaller. The degree of compensation can be defined in such a case by:

(p-type doping-n-type doping)/n-type doping; or by charge difference/charge of a doping area.

However, other definitions are also possible.

For this reason, the aim is to obtain a robust semiconductor component which is defined by a high degree of immunity to avalanching and which can withstand high current loads before and in the breakdown state, and which also can be manufactured easily in terms of the technological tolerance ranges of manufacturing processes with properties which can be satisfactorily reproduced.

Such a completely novel semiconductor component is obtained if the areas of the first and second conduction types are doped in such a way that charge carriers of the second conduction type predominate in regions close to first surface, and charge carriers of the first conduction type predominate in regions near the second surface.

The areas of the second conduction type preferably do not extend as far as the second zone, with the result that a weakly doped region of the first conduction type remains between the second surface and the second zone. However, it is possible to allow the width of this region to approach "zero". However, the weakly doped region provides various advantages such as an increase in the switch-off voltage, a "gentle" profile of the field strength and an improvement in the commutation properties of the inverse diode.

In areas of the second conduction type, a degree of compensation brought about by the doping is varied in such a way that atomic cores of the second charge type dominate close to the first surface, and atomic cores of the first charge type dominate close to the second surface. There are therefore layer sequences p, p$^-$, n$^-$, n or n, n$^-$, p$^-$, p between the two surfaces.

The effect of the nested areas of alternately different conduction type on the electrical field is, in contrast to, for example, a classic DMOS transistor, as follows ("lateral" and "vertical" relate below to a vertical transistor):

(a) there is a transverse field which is "lateral" with respect to the connecting direction between the electrodes, the strength of the transverse field depending on the proportion of lateral charge (line integral perpendicular to the lateral pn-type junction) relative to the breakdown charge. This field leads to the separation of electrons and holes and to a reduction in the current-carrying cross section along the current paths. This fact is of basic importance for understanding the processes in the avalanche, the breakdown characteristic curve and the saturation region of the characteristic curve field.

(b) The "vertical" electrical field which is parallel to the connecting direction between the electrodes is determined locally by the difference between the adjacent dopings. This means that when there is an excess of donors (n-type loading: in the charge in the n-type conductive areas exceeds the charge in the p-type areas) on the one hand, a DMOS-like field distribution (field at maximum at the blocking pn-type junction, field reducing in the direction of the opposite rear side of the component) occurs. The gradient of the field is, however, significantly lower than that which would correspond to the doping of the n-type area alone. However, on the other hand, a field distribution which rises in the direction of the rear side (p-type loading, excess of acceptors over donors) is possible as a result of overcompensation of the n-type conductive area with acceptors. In such a configuration, the field is at a maximum at the bottom of the p-type area. If the two dopings compensate one another precisely, a horizontal field distribution is produced.

The breakdown voltage is at a maximum with a precisely horizontal field distribution. If the acceptors or the donors predominate, the breakdown voltage respectively decreases. If the breakdown voltage is consequently plotted as a function of the degree of compensation, a parabolic profile is obtained.

Constant doping in the p-type and n-type conductive areas or even locally varying doping with periodic maximum values of the same magnitude leads here to a comparatively extreme maximum of the "compensation parabola". In order to arrive at a "fabrication window" (inclusion of the tolerances of all the individual relevant processes), a comparatively high breakdown voltage must be aimed at in order to achieve reliable yields and production reliability. The objective must therefore be to make the compensation parabolas as flat and wide as possible.

If switch-voltage is applied to the component, the drift path, i.e. the region of areas of opposite doping which are configured in pairs, has mobile charge carriers removed from it. The positively charged donor cores and the negatively charged acceptor cores remain in the spatial charge zone which is created. They then initially determine the profile of the field.

The current flow through the spatial charge zone brings about a change in the electric field if the concentration of the charge carriers connected to the current flow enters the region of background doping. In such a case, electrons compensate donors and holes compensate the acceptors. For the stability of the component it is therefore very important which doping is predominant locally, where charge carriers are generated and how their concentrations occur along their current paths.

For the following statements clarifying the basic mechanisms, a constant doping of p-type and n-type conductive areas is first assumed.

In the switch-on state, and in particular in the saturation range of the characteristic curve field of a MOS transistor, a pure electron stream flows out of the channel into an n-type doped area, also referred to as a "column" in a vertical transistor, increasing focusing of the current flow occurring in the depth because of the transverse electrical field. High current stability is promoted by the predominance of the n-type doping; however, because the channel region prevents, with its positive temperature coefficient, a nonhomogeneous current distribution in a cell field, this method of operation is rather noncritical. The current density can be reduced by partially screening the channel terminal (see German Patent Application DE 198 08 348 A1).

The following is to be noted with respect to the breakdown characteristic curve or its profile: electrons and holes are generated in the region of maximum field strength. The separation of the two charge carrier types is performed by the transverse electrical field. Focusing and further multiplication occurs along both current paths in the p-type area and n-type area, respectively. Finally, a partial channel screening does not have any effect either. Stability occurs only if the moveable charge carriers lead to a rise in the electrical field outside of the locations where they are produced, and thus to a rise in the breakdown voltage of the respective cell. For compensation components, this means stability in the p-type loaded region and in the n-type loaded region, but not at the maximum values of the compensation parabola. In the p-type loaded region, the breakdown takes place at the "bottom" of the column. The electrons flow out of the drift region and thus do not affect the field. The holes are drawn through the longitudinal electrical field to the upper source contact. Here, the stream of holes is focused along its path by the transverse electrical field: the current density rises here. The longitudinal electrical field is thus first affected close to the surface. Because of the compensation of the excess acceptor cores (p-type loading), a reduction takes place in the gradient of the electrical field, and a rise in the breakdown voltage. This situation is stable for as long as the field remains clearly below the critical field strength there (for silicon approximately 270 kV/cm for a charge carrier concentration of approximately $10^{15}$ cm$^{-3}$).

In the n-loaded region with an excess of donors, the breakdown is close to the surface. The holes flow to the source contact and still affect the field on the path from where they are produced up to the p-type well. The objective must therefore be to place the breakdown location as close as possible to the p-type well. This can be achieved, for example, by rising the n-type doping locally. The electrons flow through the entire drift zone to the rear side and also affect the field along their current path. Stability is obtained when the effect of the stream of electrons outweighs that of the stream of holes. Because the geometry of the cell configuraion plays an important role here, there is a region of stable and unstable characteristic curves, in particular close to the maximum value of the compensation parabola.

The conditions in the avalanche are very similar to those in the case of a breakdown. However, the currents are significantly higher and for a rated current they are up to twice the rated current of the transistor. Because the transverse electric field always brings about clear focusing of the current, the process leaves the range of stability in the case of compensation components with a comparatively low current loading. In physical terms this means that the current-induced rise in the field has already progressed to such an extent that the breakdown field strength is reached locally. The longitudinal electrical field can then no longer rise locally any further, but the curvature of the longitudinal electrical field continues to increase, resulting in a decrease in the breakdown voltage of the cell in question. This is manifested in the characteristic curve of an individual cell, and also in the simulation, by a negative differential resistance, i.e. the voltage decreases as the current rises. In a large transistor with several tens of thousands of cells, this will lead to a very quick, nonhomogeneous redistribution of the current. A filament is formed, and the transistor melts locally.

This results in the following consequences for the stability of compensation components:

(a) as a result of the separation of electrons and holes, "autostabilization" as in the case of IGBTs and diodes does not occur, but instead the degree of compensation, the field distribution and the breakdown location must he set precisely.

(b) In the case of constant doping of the p-type and n-type areas or "columns" there are stable regions in the clearly p-type loaded region and in the clearly n-type loaded region on the compensation parabola. Both regions do not correspond. For this reason, there is only an extremely small fabrication window. With constant doping of the p-type and n-type areas or columns, the compensation parabola is extremely steep. The breakdown location moves from the bottom of the p-type column in the direction of the surface within a few percent.

(c) For each compensation component there is a current destruction threshold in the avalanche which is connected directly to the degree of compensation. On the other hand, the degree of compensation determines the achievable breakdown voltage and affects the RDSon gain.

(d) In the case of constant doping of the p-type and n-type areas, the components close to the maximum value of the compensation parabola are, as stated above, unstable. This causes the components with the highest switch-off voltage to be destroyed in the avalanche test.

As explained above, in order to avoid the disadvantages, the degree of compensation is varied along the doping areas. For example, given a vertical structure from the upper side in the direction of the rear side of the transistor, the degree of compensation is varied in such a way that the atom cores of the second conduction type predominate close to the surface and the atom cores of the first conduction type predominate close to the rear side.

The resulting field distribution has a "hunched back" profile with a maximum value at approximately half of the depth. As a result, both the electrons and the holes in the breakdown and in the avalanche affect the field distribution. Both types of charge carrier have a stabilizing effect because they extend out from the location where they are generated into, in each case, areas in which they compensate the dominant excess background doping. There is thus a continuous stability range from p-type loaded to n-type loaded degrees of compensation.

A variation in the degree of compensation as a result of fabrication tolerances displaces the breakdown location only by a small amount in the vertical direction, and also continuously backward and forward, for as long as this variation is less than the technologically set variation in the degree of compensation. The magnitude of this modification of the degree of compensation also determines the limits of the saturation region. As a result, the fabrication window becomes freely selectable.

Focusing of the currents is significantly less clear because both of the types of charge carrier only cover half the path in the region of the compressing transverse electrical field. It thus becomes possible to load the components in the avalanche with significantly higher currents.

Because in one variation of the degree of compensation, for example in the direction of "n-loading", the electrical field increases in each case in the upper region of the drift path, but simultaneously decreases in the lower region (when variation in the direction of p-type loading is reversed), the breakdown voltage varies as a function of the degree of compensation only to a relatively small degree. The compensation parabola thus becomes preferably flat and wide.

The vertical variation in the degree of compensation can be effected by varying the doping in the p-type area or by varying the doping in the n-type area or by varying the doping in both areas. The variation of the doping along the columns can have a constant gradient or can take place in a plurality of steps. Basically, the variation rises, however, monotonously from a p-type loaded degree of compensation to an n-type loaded degree of compensation.

The principle above can also be readily applied in p-type channel transistors. A correspondingly modified profile of the semiconductor areas then occurs: a (p-type, p-dominant, n-dominant, n-type) profile is replaced by an (n-type, n-dominant, p-dominant, p-type) profile.

The limits of stability are reached on the n-type loaded side if the field runs horizontally close to the surface via a perceptible region of the drift path. On the p-type loaded side, the stability limit is reached if the field close to the bottom of the compensating column region runs horizontally via a perceptible region of the drift path.

It is generally the case that the compensation parabola becomes flatter and wider the greater the gradient of the degree of compensation. The breakdown voltage drops correspondingly at the maximum value of the compensation parabola.

A further important limitation of the variation of the degree of compensation is given by the requirement for the charge to be below the breakdown charge. Furthermore, when there is a severe rise in the p-column doping close to the surface current constriction effects occur (lateral JFET effect).

For example, a variation in the degree of compensation along the p-type areas and n-type areas of 50% is advantageous for 600 V components.

Applications for such lateral transistors are, for example, in the smart power field and also in microelectronics. Vertical transistors, in contrast, are predominantly produced in the field of conduction electronics.

The vertical modification of the degree of compensation can be implemented very easily because only the implantation dose has to be changed in the individual epitaxial layers. The "genuine" compensation dose is then implanted in the central epitaxial layer, in each case 10% less below it, for example, and in each case 10% more above it, for example. Instead of the implantation dose, it is, however, also possible to change the epitaxial doping.

As a result of the ability to cope with greater fluctuations it is possible to reduce the manufacturing costs. The number of necessary epitaxial layers can be reduced, and the openings for the compensation implantation can be reduced because of the higher fluctuation of the implanted dose as a result of the greater relative fluctuation of the resist dimensions with simultaneously prolonged post diffusion for the diffusing together of the individual p-type regions to form the "column".

Figure 16:
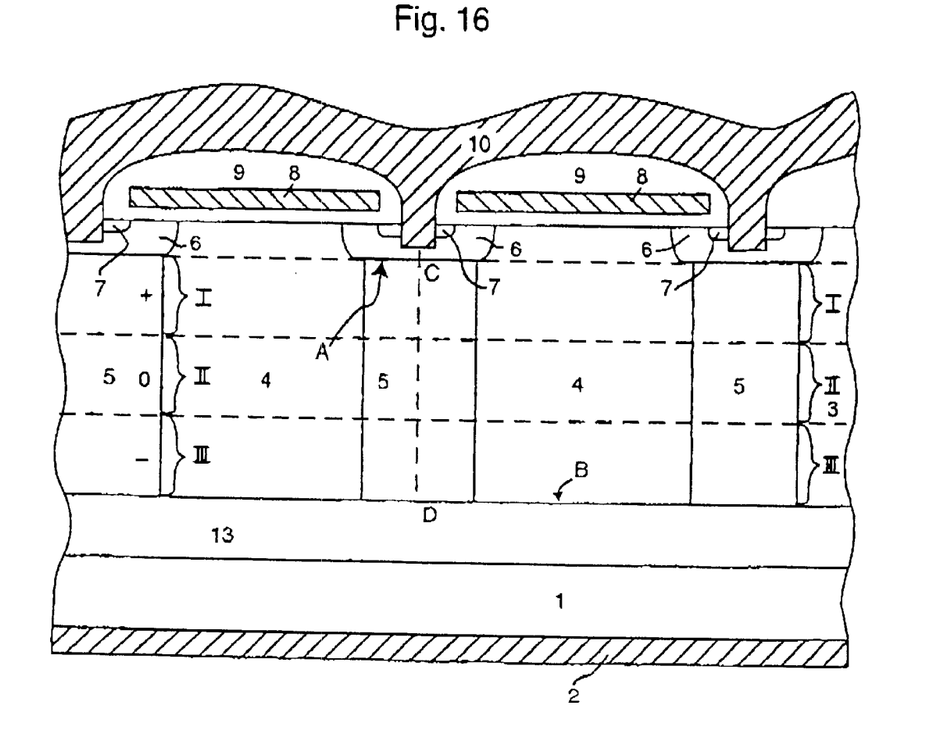
FIG. 16 shows a section through a semiconductor component manufactured by the method according to the invention.

FIG. 16 shows a section through a novel n-type channel MOS transistor with an n$^+$-conductive silicon semiconductor substrate 1, a drain electrode 2, a first n-type conductive layer 13, a second layer 3 with n-type conductive areas 4 and p-type conductive areas 5, p-type conductive zones 6, n-type conductive zones 7, and gate electrodes 8. The gate electrodes 8 are made of, for example, polycrystalline silicon or metal which are embedded in an insulating layer 9 made of, for example, silicon dioxide. The n-type channel MOS transistor also includes a source metalization 10 made of, for example, aluminum. The p-type conductive areas 5 do not reach the n$^+$-type conductive semiconductor substrate here either.

In FIG. 16, for the sake of better clarity, only the metallic layers are illustrated by hatching, although the other areas and zones are also shown in a sectional representation.

In the p-type conductive areas 5, a p-type charge excess is present in a zone I, a "neutral" charge is present in a zone II, and an n-type charge excess is present in a zone III. This means that in area 5, which forms a "p-type column", the charge of the p-type column in zone I outweighs the charge of the surrounding n-type conductive area 5, that furthermore the charge of the p-type column in zone II compensates precisely the charge of the surrounding n-type area 5, and that the charge of the p-type column in zone III does not yet outweigh the charge of the surrounding n-type area 5. It is therefore essential for the charge of the p-type areas 5 to be variable, while the charge of the n-type areas 4 is constant in each case. However, it is also possible, as in the preceding exemplary embodiments, for the charge of p-type conductive areas 5 to be constant, and the charge of the n-type conductive areas to be varied. It is also possible to make the charge variable in both areas 4 and 5.

SUMMARY OF THE INVENTION

It is accordingly an object of the invention to provide a method which easily permits the areas of the first and second conduction types to be manufactured with the desired variable doping, and which overcomes the above-mentioned disadvantageous of the prior art apparatus and methods of this general type.

With the foregoing and other objects in view there is provided, in accordance with the invention, a method for manufacturing a semiconductor component having a semiconductor element with a blocking pn-type junction that includes steps of: providing a blocking pn-type junction that is formed by a first zone of a first conduction type and an adjoining zone of a second conduction type that is opposite to the first conduction type; connecting the first zone of the first conduction type to a first electrode; providing a second zone of the first conduction type and a second electrode that is connected to the second zone of the first conduction type; defining a first surface as a side of the zone of the second conduction type that faces the second zone of the first conduction type; defining a second surface that lies between the first surface and the second zone of the first conduction type; integrating areas of the first conduction type and of the second conduction type together in a region between the first surface and the second surface; and forming the areas of the first conduction type and of the second conduction type by forming trenches and by doping and filling in the trenches so that: charge carriers of the second conduction type predominate in regions formed from portions of the areas of the first conduction type and of the second conduction type that are near the first surface; and charge carriers of the first conduction type predominate in regions formed from portions of the areas of the first conduction type and of the second conduction type that are near the second surface.

The method is preferably applied in a semiconductor element composed of silicon. However, it is also possible to apply the invention to other semiconductor materials, for example connecting semiconductors, silicon carbide etc.

In accordance with an added feature of the invention, the etching of the trenches can be adjusted by suitably selecting process parameters in such a way that a defined side wall inclination is obtained for the trenches, with the result that, for example, trenches are produced which have a smaller cross-sectional area as the depth increases. For, for example, n-type compensation components, the necessary n-type doping can then be carried out with, for example, phosphorus for the current-conducting path, either by the background doping of the semiconductor element or by constant side wall doping of the trench over the entire depth of the trench. Such side wall doping can be carried out by coverage processes, doping from the gas phase, plasma doping or by applying epitaxially deposited doped layers in the trenches. In the example of n-type compensation components, the trench is then closed partially or entirely with homogeneously epitaxially grown semiconductor material, that is to say, for example, silicon, of the p-type. The desired gradient of the compensation of p-dominant or p-loaded to n-dominant or n-loaded as the depth of the trench increases is thus obtained.

It is therefore possible to adjust the vertical profile of the doping by the geometry of the trench, which can be effected by the profile of the trench wall on the one hand, and/or by the outline of the trench on the other. In linear, elongated trench structures, the ratio of the effective doping is proportional to the trench diameter, while in the case of circular or column-shaped trenches the trench opens at the upper edge or lower edge in the square corresponding to the circular face. Correspondingly, for example, with circular trenches and homogeneous n-type background doping of the semiconductor element, side wall doping of the p-conduction type can also be used instead of epitaxial filling.

Under certain circumstances, trench etching with a strictly vertical side wall profile is simpler to achieve than a trench with a tapering cross section. So that, nevertheless, this tapering cross section can still be achieved overall, and a defined stepped tapering of the trench profile into the depth of the trench can be obtained using one or more spacing-element or spacer etching steps. A first trench etching operation is started here as far as a certain partial depth. Subsequently, a side wall spacer is formed in the customary way, for example by oxide deposition and anisotropic back-etching. There is then the further trench etching operation, and these steps are, if appropriate, to be repeated many times. Finally, the mask and the spacer are removed.

In accordance with an additional feature of the invention, there is provided a variation of the above method, in which it is possible to achieve, for example, a stepped configuration of p-type doping as the depth of the trench increases, by repeatedly interrupted trench etching. One possibility is then to perform the side wall doping in each case after a certain partial depth of the etching of the trench has been reached. This results in an increased doping dose being obtained in the upper parts of the trench by the addition of the respective partial doped amounts. This method can also be combined, for example, with an ion implantation after each partial etching step by, for example, diffusing out the implanted dose in the bottom of the trench directly after the implantation step in each case. The portion of the dose which is diffused out laterally in this way is not removed by the next trench partial etching step. Finally, the individual p-type conductive areas which are obtained in this way are ultimately connected by diffusion. If the ion implantation takes place at a low angle with respect to the depth of the trench, a certain amount of doping also occurs in the side walls of the trench. The reduction in the doping as the depth of the trench increases can readily be performed on each plane by selective adjustment of the implantation dose.

In accordance with another feature of the invention, when doping methods which can be masked by materials such as photoresist are used, which applies in particular to ion implantation and plasma doping, a repeatedly stepped side wall doping of the trenches can also be obtained. The repeatedly stepped side wall doping of the trenches can be obtained if, after continuous deep trench etching, the trench is partially filled in again with a material with a sufficiently low viscosity, for example photoresist. By simple etching methods it is then possible to remove this photoresist filling again incrementally, the respectively exposed part of the side wall of the trench is doped at each step in between. As a result, an increased doping concentration is obtained in the upper parts of the trench by adding the respective partial doses of the individual doping operations.

In accordance with a further feature of the invention, in doping methods which cannot be masked with resist, for example in covering methods, the method just explained above can be modified in such a way that the trench is additionally filled with an insulating layer, for example silicon dioxide. The insulating layer is deposited by a CVD method, and is back-etched incrementally. Alternatively, it is, however, also possible to line the trench with the insulating layer, for example thermally deposited silicon dioxide, before the photoresist is introduced into the trench, and to remove the exposed part of the insulating layer by etching after the resist is back-etched. After the remaining photoresist is removed, a lower part of the trench which can be specified as desired is masked against doping.

By suitably selecting the process parameters, the side wall doping of the trench out of the gas phase can be set in such a way that depletion of the dopant toward the trench bottom occurs, as is desired, for example, for p-type doping. This applies, in particular, when there are high aspect ratios of the trench etching, such as are necessary with compensation components with a high breakdown voltage and a low switch-on resistance. Alternatively, this can also be achieved by a non-conformal epitaxial deposition of, for example, a p-type conductive semiconductor layer in the trench.

In accordance with yet an added feature of the invention, it is also possible to add a further etching medium, for example hydrochloric acid, during the epitaxial deposition: if the deposition outweighs the etching, a profile is obtained which has, for example, an increased n-type doping concentration in the direction of the trench bottom.

With implantation methods it is possible to obtain a doping dose which decreases as the depth increases, by suitably combining rotation, tilt angle and energy of the dopant ions using the scattering of the ions at the trench side walls. For this purpose, it is generally necessary to implant the semiconductor element with different rotation angles so that asymmetry of differently oriented trench walls does not result. With high aspect ratios in the trench it may be expedient to apply successively different tilt angles, and if appropriate implantation at an angle of 0° may also be carried out.

As is known, certain types of defects may lead to anisotropic diffusion behavior in the crystal. This property can be used for selective depth diffusion of, for example, p-type conductive columns along the defects, with the dopant concentration decreasing automatically here by virtue of the diffusion gradient as the depth of the defects increases. The defects can be generated, for example, with an extreme high-energy implantation over a surface of the semiconductor element, onto which, for example, p-type conductive dopant is applied with a mask, with subsequent deep diffusion. The defects can then be eliminated.

If a vertical trench with a constant, for example p-type conductive side wall doping or epitaxial p-type filling, is used, the degree of compensation can be displaced in the direction of p-type dominance with respect to the surface of the semiconductor element by n-type conductive background doping of the semiconductor element over the surface. The doping concentration of this background doping decreases toward the surface of the semiconductor element.

This can be carried out, for example, by a basic material with a plurality of epitaxial layers with different n-type doping or by graduated doping during the deposition. A further possibility is to diffuse in an n-type dopant from the rear side of the semiconductor element, in which case the semiconductor element should, under certain circumstances, be relatively thin in order to make it possible to deal with long diffusion times which are otherwise necessary.

A typical phenomenon with plasma-supported anisotropic trench etching operations, in particular with high aspect ratios of trenches, is the decrease in the trench depth as a function of the opening of the trench at a given etching time. This results in various possible ways of utilizing this phenomenon to implement vertically stepped p-type dopant profiles. It is thus possible to etch a central trench with the full target depth, directly adjacent "satellite" trenches having a reduced diameter. If appropriate, multiple stepping can thus also be achieved. The central trench is then provided, for example, with a homogeneous n-type doping, while the satellite trenches are masked. All the trenches are then subsequently provided with p-type doping. The n-type doping can also be present homogeneously as background doping in the semiconductor element. Because the doped areas in a compensation component are completely cleared of mobile charge carriers when switched off, the lateral spatial separation of the trenches does not play an important role. In the spatial center there remains an excess of p-type charge carriers as far as the depth which is respectively defined by the neighboring trenches. With this concept it is also possible to spatially separate p-type and n-type conductive "columns" so that, for example, the central trench can be used as an n-type doped electron path, while incremental p-type compensation is achieved with the satellite trenches which are reduced in diameter incrementally, and thus also reduced in depth.

The stated possible ways of implementing vertical doping gradients in the case of compensation components are decisive, in particular in the case of trench technology, because they permit the location of the breakdown to be moved into the outer surface of the trench, and thus away from critical points such as the bottom of the trench. As a result of the greater fluctuation which can be dealt with according to the invention, it is also possible to raise the necessary stringent demands made of the fabrication tolerances in terms of etching dimensions of the trench etching, dose of the various side wall doping operations and filling operations etc., to such an extent that a manufacturable semiconductor component is produced.

It is possible to adjust the process parameters of epitaxial processes in such a way that the deposition on oxide-covered surfaces is suppressed, with the result that selective epitaxy occurs. If the oxide mask is left on the semiconductor element after trench etching and if a thin oxide side wall spacing is then produced in the trench using a customary method, for example, by thermal oxidation and subsequent anisotropic back-etching of the oxide, the method of selective epitaxy can be used to fill in the trench with monocrystalline silicon, which, however, grows starting from the bottom of the trench as a result of the side wall being covered with oxide. This provides the possibility of changing the doping during the epitaxial process and thus obtaining, in principle, any desired vertical doping profiles. The respective constant counter-doping may be provided either as homogeneous background doping of the semiconductor element or by means of trench side wall doping before the oxide side wall spacer is produced. The electron current paths and hole current paths are thus separated vertically by an insulator, this being insignificant for the basic operational capability of the compensation component.

In accordance with a concomitant feature of the invention, the method includes providing the trenches with side walls; covering the side walls of the trenches with an insulating layer; and epitaxially filling the trenches with semiconductor material having a variable doping profile.

Basically, those methods in which the net p-type loading toward the surface of the semiconductor element is achieved by varying the p-type doping with constant n-type doping must be preferred over those methods which have either exclusively or additionally a vertical gradient in the n-type doping, because the switch-on resistance is increased in the latter.

Other features which are considered as characteristic for the invention are set forth in the appended claims.

Although the invention is illustrated and described herein as embodied in a method for manufacturing a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the figures, in each case the same reference symbols have been used for components that correspond to one another.

Figure 1:
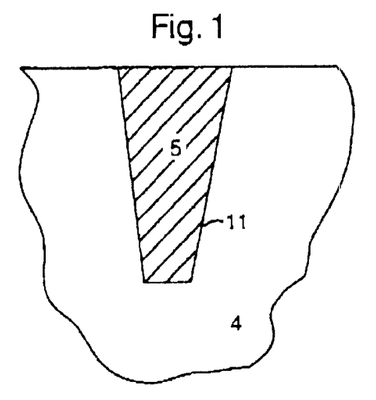
FIGS. 1 to 3 show sectional views illustrating various methods for etching a trench with a defined side wall inclination.

Referring now to the figures of the drawing in detail and first, particularly, to FIG. 1 thereof, there is shown, a trench 11 in an n-type conductive semiconductor area 4. This trench 11 is filled epitaxially with semiconductor material with the result that a p-type conductive area 5 is produced. The trench 11 has a structure which tapers downward to its bottom, i.e. it becomes smaller and smaller as the depth increases.

The configuration shown in FIG. 1 can be used for n-type compensation components. The n-type doping of the current-conducting path which is necessary for these components is obtained by the background doping, i.e. the doping of the area 4 in the silicon semiconductor element.

Figure 2:
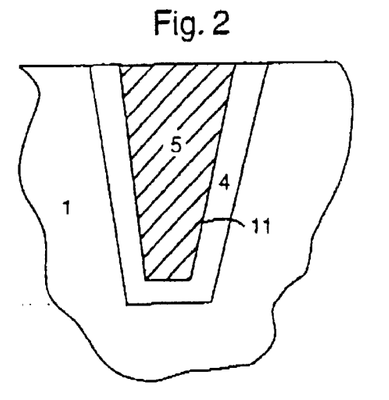

FIG. 2 shows a different exemplary embodiment in which the trench 11 is provided with side wall doping in its wall faces so that the n-type conductive area 4 is formed by the side walls of the trench 11 in an i-type conductive semiconductor element 1. The structure shown in FIG. 2 can be formed by a covering process, doping out of the gas phases, plasma doping or by epitaxial deposition of an appropriate layer.

In the exemplary embodiments in FIGS. 1 and 2, the p-type conductive areas 5 are formed by epitaxially growing silicon. In both cases, the desired gradient of compensation of p-type loaded to n-type loaded is obtained as the depth of the trench 11 increases. By the geometry of the trench 11, it is thus possible to adjust the vertical profile of the dopant concentration, which is achieved, on the one hand, by the profile of the trench wall (see FIG. 2) and, on the other hand, also by the outline of the trench 11. In the case of linear, elongated trench structures, the ratio of the effective doping is proportional to the diameter of the trench 11, while in the case of circular or column-shaped trenches 11 the trench is open at the upper edge or lower edge corresponding to the circular face in the square.

Figure 3:
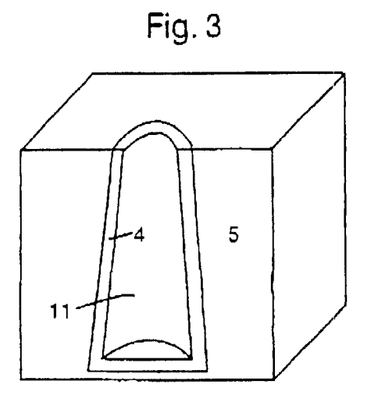

It is also possible to provide side wall doping of the n-type with circular trenches 11 and a homogeneous p-type background doping instead of epitaxial filling in of the trench 11, with the result that in the case of a trench which becomes wider in the downward direction as the depth increases there is a changeover from p-type loading to n-type loading (see FIG. 3).

FIGS. 4a to 4d show a method in which trench etching with a vertical side wall inclination and an incremental spacer is performed. Under certain circumstances, it is, in fact, easier to achieve trench etching with a strictly vertical side wall profile than with an oblique side wall profile, as is used in the methods illustrated in FIGS. 1 to 3. With a vertical side wall inclination, defined stepped tapering of the trench profile in the downward direction can be achieved using one or more spacer etching steps. Firstly, in a first etching step using a masking layer 12, a first trench 14 is made to a specific partial depth (see FIG. 4a) in an n-type conductive semiconductor element. A side wall spacer is then produced by, for example, depositing silicon dioxide and anisotropic back-etching in the customary way (see FIG. 4b). There is then further trench etching, during which the trench 14 which is covered with the side wall spacer 15 is "deepened" at its bottom, with the result that a trench 16 is produced (see FIG. 4c).

Figure 4A:
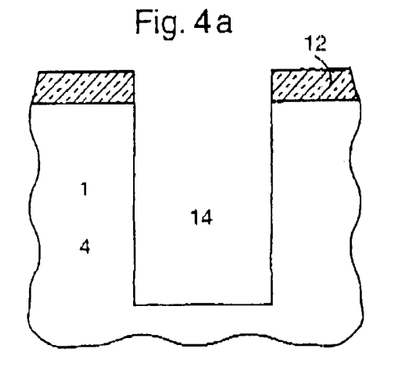
FIGS. 4a to 4d show sectional views illustrating a method for etching a trench with a vertical side wall inclination and incremental spacers.
Figure 4B:
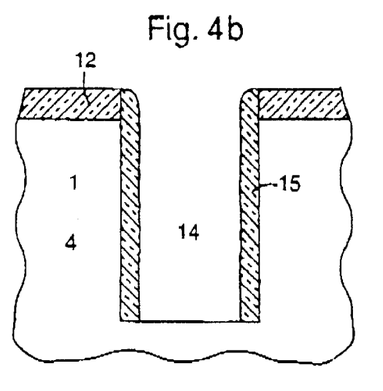
Figure 4C:
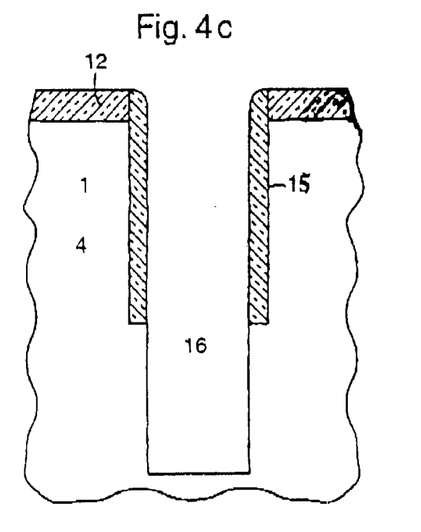

If appropriate, these steps can be carried out repeatedly with side wall coverage and deepening of the trench.

Figure 4D:
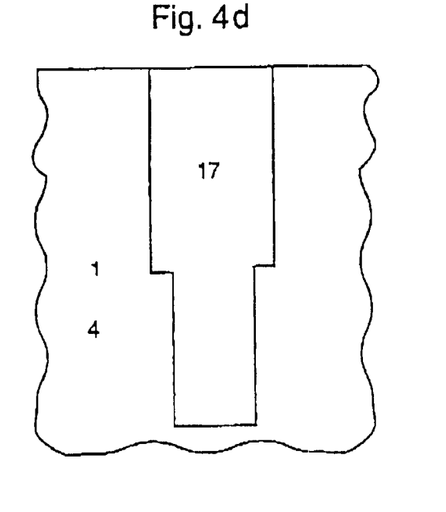

After removal of the masking layer 12 and of the side wall spacer 15, a structure is ultimately obtained in which a trench 17 tapers incrementally in the downward direction (see FIG. 4d).

Finally, this trench 17 can be treated in the way explained with reference to FIGS. 1 and 2: the trench 17 is filled, for example epitaxially, with p-type conductive silicon, with the result that a p-type conductive area 5 is produced whose width decreases incrementally from top to bottom. However, it is also possible to perform side wall doping in accordance with the example in FIG. 2.

An additional possibility is to introduce n-type side wall doping straight after the step in FIG. 4c, which n-type side wall doping is then masked in the upper part of the trench 16 by the side wall spacer 15. As a result, it is then possible, in combination with subsequent n-type and/or p-type side wall doping after removal of the side wall spacer 5, to obtain a net excess of p-type charge carriers in the upper part of the trench.

Figure 5A:
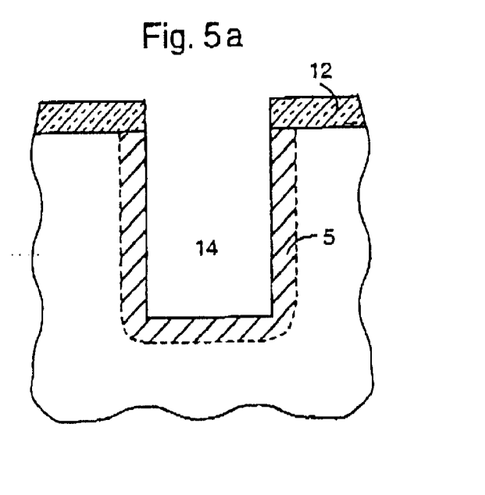
FIGS. 5a, 5b, 6a, and 6b show sectional views illustrating two variants of a trench etching process with a vertical side wall inclination and stepped side wall doping with repeatedly interrupted trench etching.
Figure 5B:
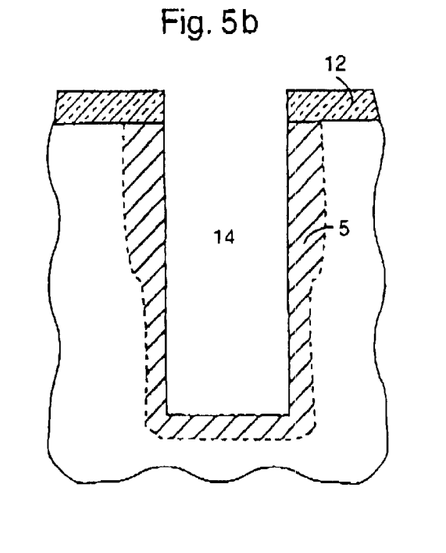

In a trench etching method with a vertical side wall, as has been explained above with reference to FIGS. 4a to 4d, it is also possible to step the p-type doping as the depth increases by repeatedly interrupted trench etching. This is possible, for example, by performing the side wall doping each time after a specific partial depth of the trench etching is reached. Such an example is shown in FIG. 5a in which, after a trench 14 is etched, side wall doping is carried out in order to produce a p-type conductive area 5. After this doping, the trench 14 is deepened again and this is then followed by further side wall doping in which the effects of the doping operations are superimposed on one another in the upper part of the trench and an increased doping concentration is obtained there (see FIG. 5b). In the upper parts of the trench 14, there is therefore an increased wall dose which is due to the addition of the respective partial doses during the individual doping operations after a respective partial depth is reached.

Figure 6A:
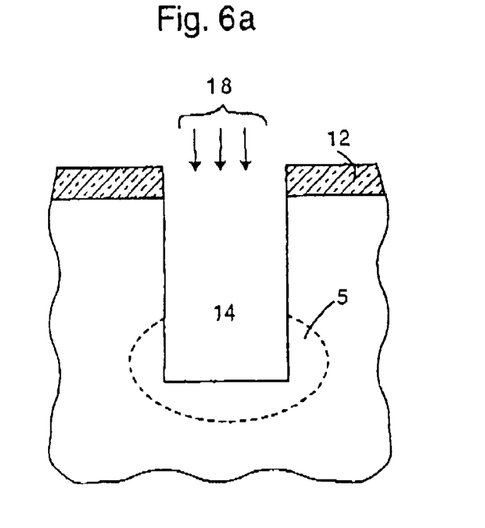
Figure 6B:
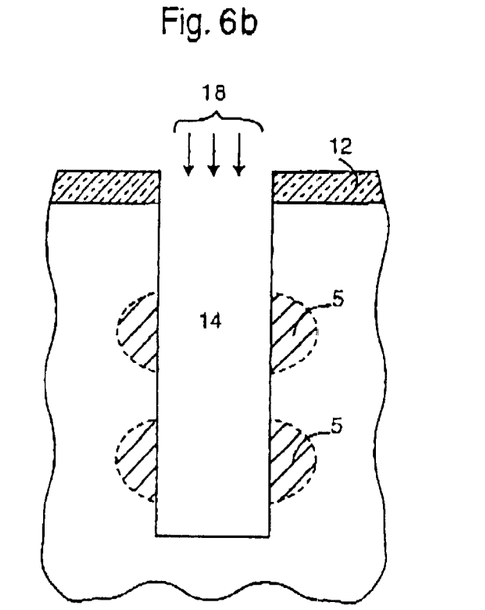
Figure 7A:
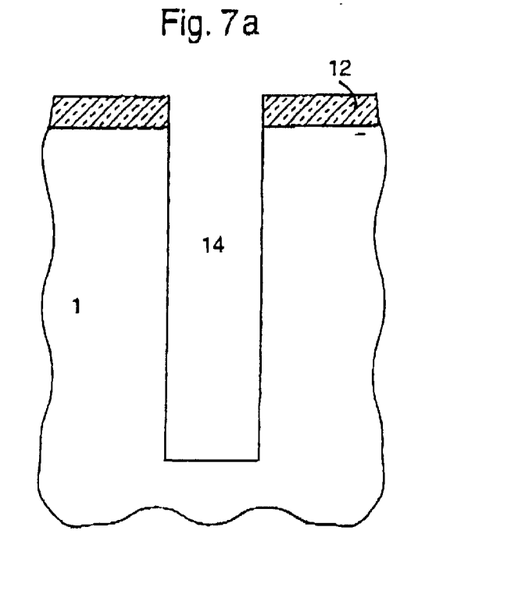
FIGS. 7a to 7d show sectional views illustrating a trench etching process with a vertical side wall inclination and stepped side wall doping by repeatedly stepped back-etching of a resist filling.
Figure 7B:
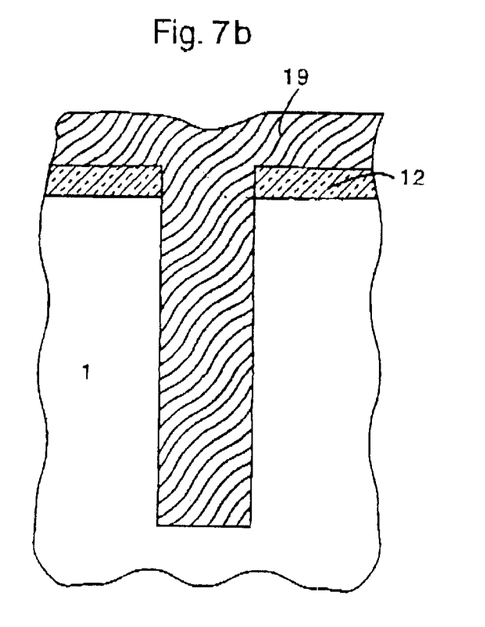
Figure 7C:
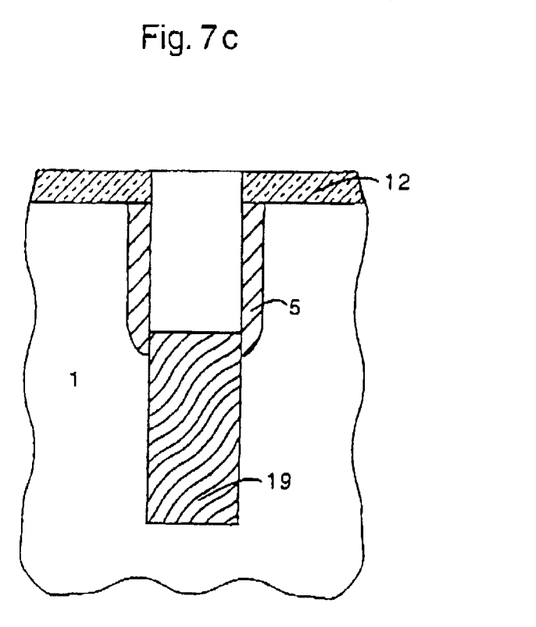
Figure 7D:
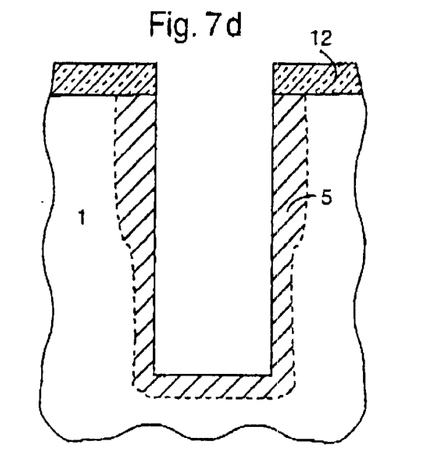

This procedure can be applied after each partial etching step even, for example, in the case of ion implantation (see FIG. 6a). After the trench 14 is made, ion implantation (see arrow 18) is performed, with the result that a p-type conductive area 5 is produced at the bottom of the trench 14. The trench 14 is subsequently deepened in a further etching step and renewed ion implantation (see FIG. 6b) occurs. In this way, p-type conductive areas 5 are produced at the edge and at the bottom of the trench 14 and are finally connected to one another by diffusion. This connection can be promoted by performing the ion implantation at a low angle with respect to the depth direction of the trench 14, during which a specific dose of the implanted ions also reaches the side walls of the trench 14. The reduction in the net p-type concentration as the depth of the trench 14 increases can easily be achieved by selectively adjusting the ion implantation dose at each level of the bottom of the respective partial trenches. When doping methods which can be masked by materials such as photoresist are used, which applies in particular to ion implantation and plasma doping methods, the repeatedly stepped side wall doping of the examples shown in FIGS. 5a, 5b, 6a, 6b can also be achieved. After continuous deep trench etching (see FIG. 7a) the trench is filled in again (see FIG. 7b) by a material with a sufficiently low viscosity, for example photoresist 19. The photoresist 19 is then incrementally removed by simple etching methods, in which case, after each removal of the photoresist 19, the part of the side wall of the trench 14 which is then exposed in each case is doped with p-type dopant, for example boron (see FIG. 7c). The repeated doping ultimately results in an increased wall dose in the upper parts due to the addition of the respective partial doses (see FIG. 7d).

In doping methods which cannot be masked with resist, that is to say, for example, in of all the coverage methods, the exemplary embodiment explained with reference to FIGS. 7a to 7d can be modified in such a way that the trench 14 is filled with silicon dioxide, for example by CVD (chemical vapor deposition) and then is incrementally back-etched. For this reason, silicon dioxide is used instead of the photoresist in FIGS. 7a to 7d.

Figure 8A:
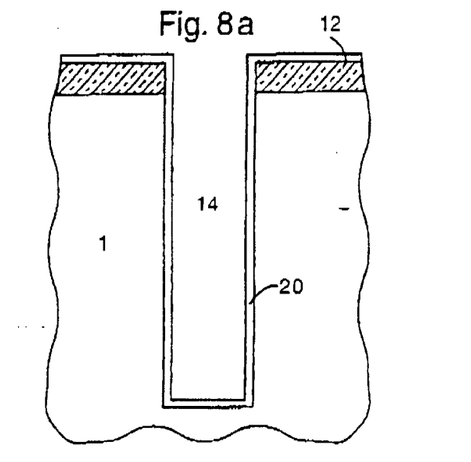
FIGS. 8a to 8d show sectional views illustrating a trench etching process with a vertical side wall inclination and stepped wall doping by repeatedly stepped back-etching of an oxide filling or resist filling, which is combined with a wall oxide.
Figure 8B:
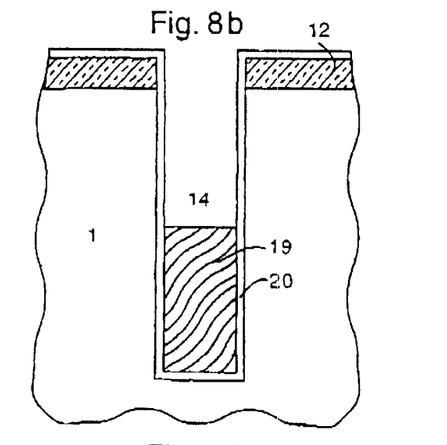
Figure 8C:
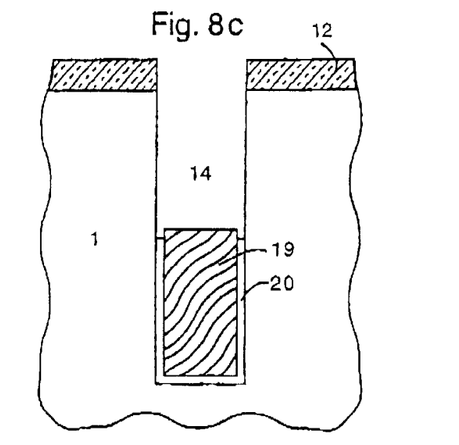
Figure 8D:
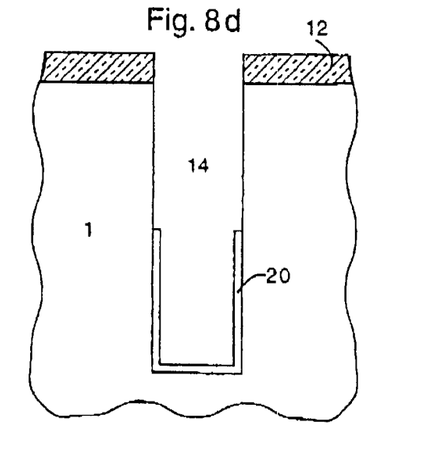

However, since a void-free oxide lining is technically very demanding when the trench 14 has high aspect ratios, it is possible, as an alternative, to proceed in the following way. Before the photoresist 19 is introduced into the trench 14 the latter is firstly lined with a silicon dioxide layer 20, which can be carried out by a thermal method (see FIG. 8a). Photoresist 19 is then introduced and back-etched (see FIG. 8b), and the exposed part of the oxide layer 20 is removed (see FIG. 8c), which can be carried out by etching. The residual photoresist 19 is then removed so that a lower part of the trench 14 which can be specified as desired is masked against doping by the remaining silicon dioxide layer 20. In this way, a stepped doping profile with p-type doping can be obtained whose dopant quantity decreases from the top to the bottom.

Figure 9A:
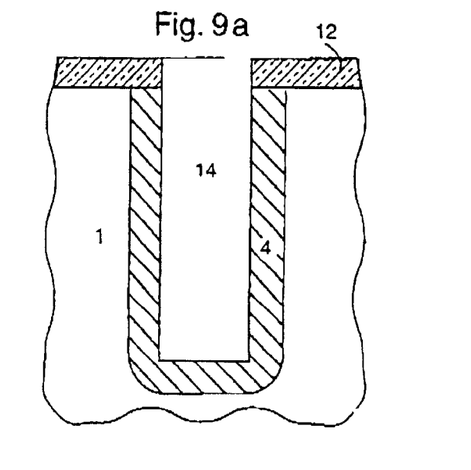
FIGS. 9a to 9c show sectional views illustrating a trench etching process with a vertical side wall inclination and stepped side wall doping by repeatedly stepped back-etching of a resist filling and widening of the trench by isotropic etching.
Figure 9B:
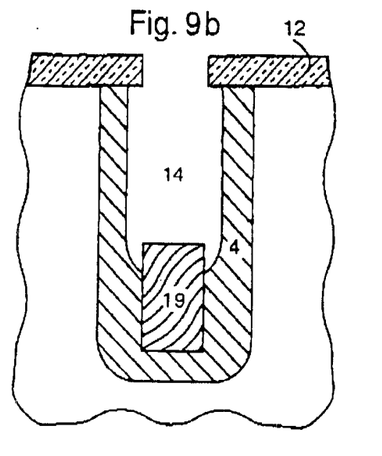
Figure 9C:
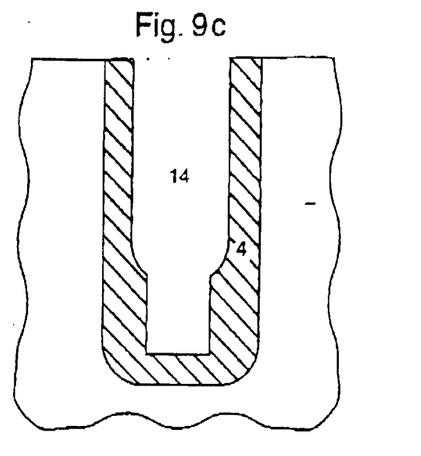

The method explained above with reference to FIGS. 7a to 7d can also be combined with an isotropic silicon etching process instead of the step in FIG. 7c, which leads to a similarly stepped trench shape, as with the method illustrated in FIGS. 4a to 4d. In addition, n-type doping which increases with the depth of the trench can thus be achieved by performing n-type side wall doping after the trench etching (see FIG. 9a), and then covering the lower part of the trench with, for example, photoresist 19 and partially removing the trench wall of the part lying above it, with the result that the trench 14 is wider there. This removal of the trench wall also causes parts of the n-type side wall dose to be removed (see FIG. 9b). The result is that ultimately, in combination with subsequent p-type doping or p-type filling, there is an excess of p-type charge carriers which increases toward the surface of the semiconductor element 1.

Figure 10A:
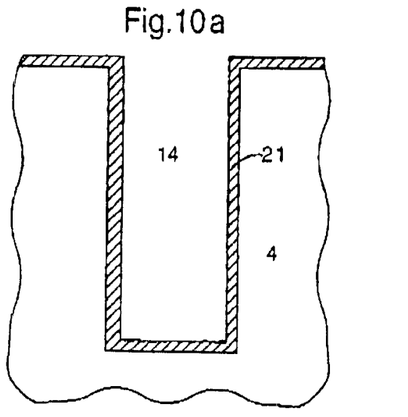
FIGS. 10a, 10b and 11 show sectional views illustrating a method with an incrementally varying side wall profile by doping or filling with limited diffusion.
Figure 10B:
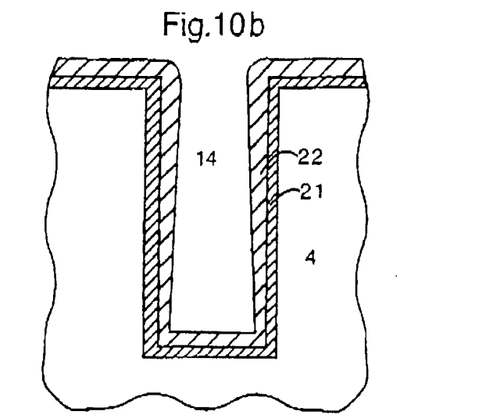

By suitably selecting the process parameters, the side wall doping of the trench 14 out of the gas phase can be set in such a way that there is depletion of the dopant toward the trench bottom, as is desired for p-type doping. This results in a region with "controlled diffusion". This applies in particular with high aspect ratios of the trench etching such as are necessary in compensation components with a high breakdown voltage and a low switch-on resistance. Alternatively, this can also be achieved by a non-conformal epitaxial p-type deposition in the trench, which can also be achieved by suitably selecting the process parameters for the region with controlled diffusion. In addition, room for maneuver in terms of optimization is obtained since the epitaxial deposition process is varied gradually from a conformal deposition of a p-type conductive layer 21 (see FIG. 10a) to a non-conformal deposition of a p-type conductive layer 22 (see FIG. 10b).

Figure 11:
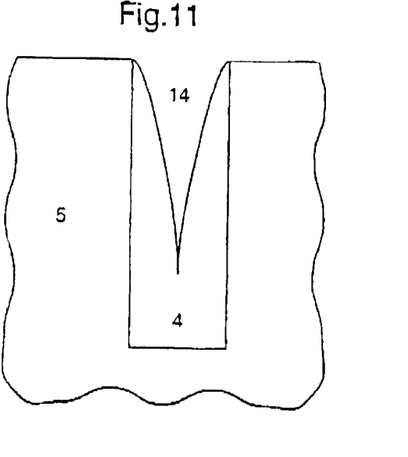

An opposite effect can be achieved with an epitaxial deposition of the n-type in which an etching medium, for example hydrochloric acid, is also added during the deposition itself. If the deposition rate outweighs the etching rate, a profile is obtained in which there is increased n-type doping in the direction of the bottom of the trench (see FIG. 11).

In implantation methods, a dose which decreases as the depth increases can be achieved (see FIG. 12) by suitable combination of rotation, tilt angle and energy of the dopant ions using the scattering of the ions against the side walls of the trench 14. For this purpose, it is generally necessary to implant the semiconductor element 1 at different tilt angles so that there is no asymmetry between differently oriented trench walls. Furthermore, in the case of high aspect ratios of the trench, it may be necessary to operate in the trench with a successive combination of tilt angles including implantation at an angle of 0°.

Figure 12:
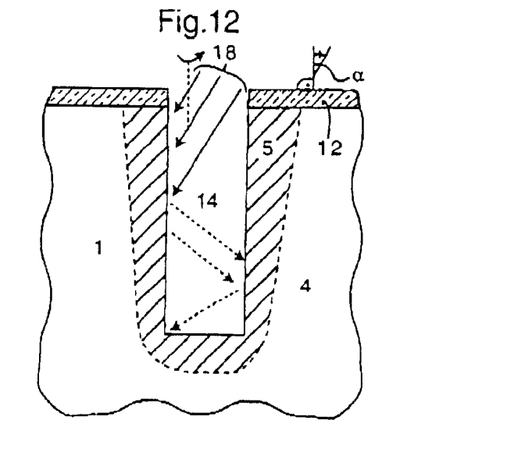
FIG. 12 shows a sectional view illustrating a method in which a varying side wall profile is produced by ion implantation.

Such a procedure is indicated schematically in FIG. 12 with a tilt angle α for the ion implantation 18. The lower doping as the depth of the trench increases occurs as a result of the fact that the "reflected" ion beams decrease in intensity as the trench 14 gets deeper, with the result that an increasingly weak dose is obtained there.

Certain types of defects may lead to anisotropic diffusion behavior in the silicon connecting semiconductor or silicon carbide crystal of a semiconductor element. This property can be used for selective deep diffusion of, for example, p-type conductive columns along the defects, the concentration decreasing automatically by virtue of the diffusion gradient as the depth increases. The defects can be produced, for example, with an extreme high-energy implantation over the surface of the semiconductor element 1, onto which the p-type conductive dopant, that is to say for example boron, is applied with a mask, with subsequent deep diffusion. It is of course important that the defects can subsequently be eliminated.

Figure 13:
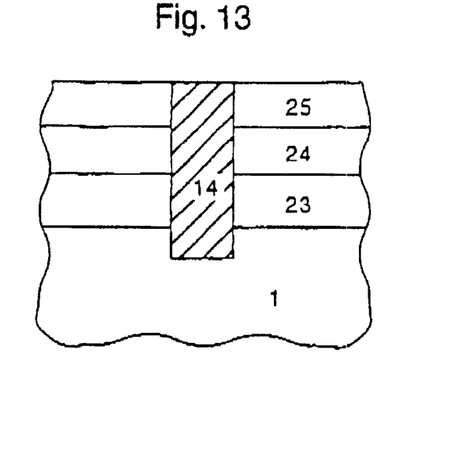
FIG. 13 shows a sectional view illustrating a method with variable background doping of the semiconductor element.

If a vertical trench 14 with constant p-type side wall or epitaxial p-type filling is used, the degree of compensation can also be displaced in the direction of p-loading with respect to the surface of the semiconductor element 1 by n-type background doping over the surface. The concentration of which n-type background doping decreases toward the surface. This can be achieved, for example, by a basic material with a plurality of epitaxial layers 23, 24, 25 with different n-type doping (see FIG. 13) or by graduated doping during the deposition. Thus, in FIG. 13, for example, the layer 23 is more strongly doped than the layer 24, and the layer 24 is in turn more strongly doped than the layer 25.

A further possibility is to diffuse in an n-type dopant from the rear side of the semiconductor element, it being then necessary to make the semiconductor element relatively thin in order to avoid possibly long diffusion times.

A typical phenomenon with plasma-supported anisotropic trench etching operations, in particular with high aspect ratios, is known to be the decrease in the trench depth as a function of the opening of the trench at a given etching time. This results in various possible ways of utilizing this phenomenon to implement vertically stepped p-type doping profiles.

Figure 14:
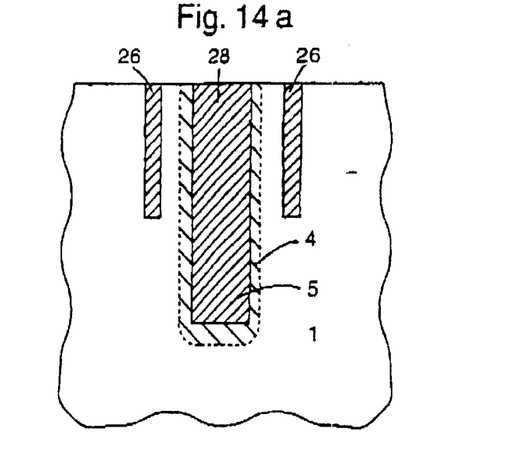
FIGS. 14a to 14c show sectional views illustrating a method in which trenches with different cross sections are combined.

FIG. 14 shows such a possibility: an etching step etches both a central trench 28 with full target depth and directly adjacent satellite trenches 26 with a reduced diameter. The trench 28 is provided with an n-type conductive area 4 in the i-type conductive semiconductor element 1. The trenches 26, 28 are subsequently filled with p-type conductive semiconductor material, that is to say in particular silicon.

If appropriate, it is also possible to provide repeated stepping, as indicated in FIG. 14b.

Another possibility is shown in FIG. 14c: here, the central trench 28 is provided with homogeneous n-type doping, with a result that there is an n-type conductive area 4, while the satellite trenches 26 have p-type doping and form p-type conductive areas 5.

However, if appropriate, it is also possible to provide the n-type doping homogeneously as background doping.

It is to be noted here that in the case of a compensation component the doped areas are cleared completely of mobile charge carriers when switched off. For this reason, the lateral spatial separation of the trenches 26, 28 does not play an important role. A p-type excess remains in the spatial center as far as the depth which is respectively defined by the neighboring trenches. It is therefore possible also to spatially separate the p-type and n-type "columns", as is shown in the example in FIG. 14c: the central trench 28 is used as an n-type doped electron path, while incremental p-type compensation is achieved with the satellite trench 26 which is incrementally reduced in diameter and thus also reduced in depth.

The above mentioned possible ways of implementing vertical doping gradients in compensation components are decisive, in particular in trench technology, because they permit the location of the breakdown to be moved into the outer surface of the trench and thus away from critical points such as the bottom of the trench. As a result of the ability to cope with greater fluctuation, which the present invention offers, it is also possible to raise the necessary stringent demands made on the fabrication tolerances relating to the etching dimensions of the trench etching, dose of the various side wall doping operations and filling operations, etc., to such an extent that a highly manufacturable component is produced.

Figure 15:
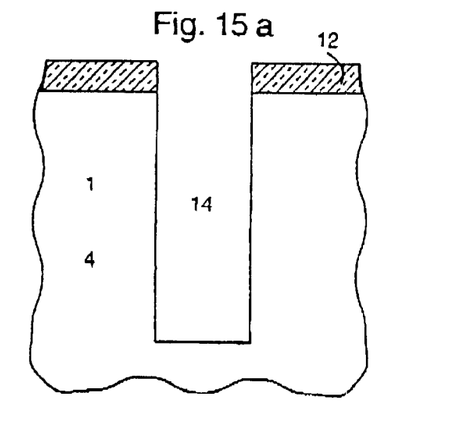
FIGS. 15a to 15d show sectional views illustrating a method in which a trench with a vertical side wall and a filling with selective epitaxy are used.
Figure 15C:
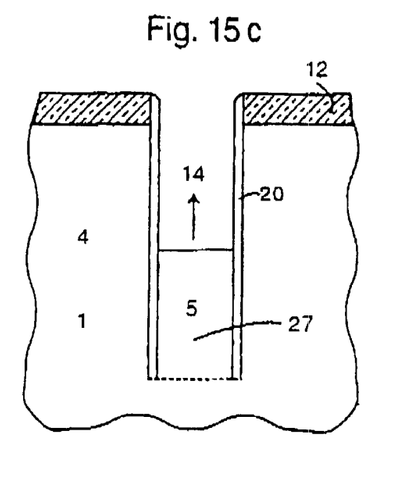
Figure 15D:
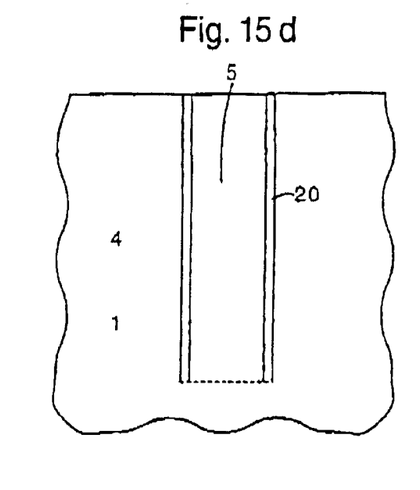

Finally, it is possible to adjust the process parameters of epitaxial processes in such a way that the deposition on oxide-covered surfaces is suppressed and a so-called "selective epitaxy" occurs. If a masking layer 12, made of silicon dioxide, for example, is left on the semiconductor element 1 after trench etching, as is indicated in FIG. 15a, and if a thin side wall spacer 15 made of silicon dioxide is then produced in the trench 14 using a customary method, which can be carried out, for example by thermal oxidation and subsequent anisotropic back-etching (see FIG. 15b), then the method of "selective epitaxy" can be used to fill in the trench 14 with monocrystalline silicon 27. The monocrystalline silicon 27, however, grows starting from the bottom of the trench as a result of the side wall being covered with oxide (see FIG. 15c). This provides the possibility of changing the doping during the epitaxial process and thus, of obtaining, in principle, any desired vertical doping profiles. The respective constant counter-doping may be provided either as homogeneous background doping of the semiconductor element 1 or else can be carried out by trench side wall doping before the spacer 15 is produced. The electron current paths or hole current paths are thus separated vertically by an insulator (see FIG. 15d), which does not however, play any role in terms of the basic operational capability of the compensation element.

Various methods for manufacturing the areas 4, 5 of the semiconductor component illustrated in FIG. 16 have been described above. The remaining parts of this semiconductor element, that is to say in particular the first zone of the first conduction type, the zone of the second conduction type and the second zone of the first conduction type as well as the electrodes connected to these zones are produced in a customary way, which can be carried out by appropriate diffusion ion implantation epitaxy steps and metalization steps.

The essential feature of the present invention is therefore the production of the areas of the first and second conduction types in such a way that charge carriers of the second conduction type predominate in regions close to a first surface, and charge carriers of the first conduction type predominate in regions close to a second surface, as is the case in all the exemplary embodiments in FIGS. 1 to 15.

We claim:

1. A method for manufacturing a compensation component having a semiconductor element with a blocking pn-type junction, which comprises:

providing a blocking pn-type junction that is formed by a first zone of a first conduction type and an adjoining zone of a second conduction type that is opposite to the first conduction type;

connecting the first zone of the first conduction type to a first electrode;

providing a second zone of the first conduction type and a second electrode that is connected to the second zone of the first conduction type;

defining a first surface as a side of the zone of the second conduction type that faces the second zone of the first conduction type;

defining a second surface that lies between the first surface and the second zone of the first conduction type;

integrating areas of the first conduction type and of the second conduction type together in a region between the first surface and the second surface;

forming the areas of the first conduction type and of the second conduction type by forming trenches and by doping and filling in the trenches so that:

charge carriers of the second conduction type predominate in regions formed from portions of the areas of the first conduction type and of the second conduction type that are near the first surface; and charge carriers of the first conduction type predominate in regions formed from portions of the areas of the first conduction type and of the second conduction type that are near the second surface.

2. The method according to claim 1, which comprises forming the trenches with a cross section which changes from the first surface to the second surface.

3. The method according to claim 2, which comprises:

providing the trenches with side walls; and the step of doping the trenches includes doping the side walls of the trenches homogeneously by performing a process selected from the group consisting of covering, doping from a gas phase, and plasma doping.

4. The method according to claim 2, which comprises:

providing the trenches with side walls; and depositing a doped epitaxial layer on the side walls of the trenches.

5. The method according to claim 1, wherein the step of forming the trenches includes at least two steps to form the trenches with depths and with cross sections that become smaller as the depths of the trenches increase.

6. The method according to claim 5, which comprises:

providing the trenches with side walls; and the step of doping the trenches includes doping the side walls of the trenches.

7. The method according to claim 1, wherein:

the step of forming the trenches includes performing several process steps; and the step of doping the trenches includes doping after each one of the process steps performed to form the trenches.

8. The method according to claim 7, which comprises performing the doping by ion implantation.

9. The method according to claim 8, which comprises:

providing the trenches with side walls; and performing the ion implantation at a small angle with respect to a vertical so that the side walls of the trenches are also doped.

10. The method according to claim 1, which comprises bringing an etching medium into effect in the trenches during an epitaxial deposition.

11. The method according to claim 1, which comprises:

providing the trenches with depths in a depth direction; and performing an ion implantation in the trenches at an angle of inclination with respect to the depth direction of the trenches.

12. The method according to claim 1, which comprises performing diffusion along defects in the trenches and the subsequently eliminating the defects.

13. The method according to claim 1, wherein the step of forming the trenches includes forming the trenches in a semiconductor element with a variable background doping.

14. The method according to claim 1, wherein the step of forming the trenches includes forming trenches with differing depths and widths.

* * * * *